US006901119B2

(12) United States Patent
Cideciyan et al.

(10) Patent No.: US 6,901,119 B2
(45) Date of Patent: May 31, 2005

(54) METHOD AND APPARATUS FOR IMPLEMENTING SOFT-INPUT/SOFT-OUTPUT ITERATIVE DETECTORS/DECODERS

(75) Inventors: Roy Daron Cideciyan, Rueschlikon (CH); Jonathan Darrel Coker, Rochester, MN (US); Ajay Dholakia, Gattikon (CH); Evangelos S. Eleftheriou, Zurich (CH); Richard Leo Galbraith, Rochester, MN (US); Thomas Mittelholzer, Zurich (CH); David James Stanek, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 760 days.

(21) Appl. No.: 09/792,325

(22) Filed: Feb. 22, 2001

(65) Prior Publication Data

US 2002/0154712 A1 Oct. 24, 2002

(51) Int. Cl.$^7$ .............................. H04L 27/06; H03D 1/00
(52) U.S. Cl. ....................... 375/341; 375/291; 714/792; 714/795; 714/796
(58) Field of Search ................................ 375/229, 232, 375/262, 265, 341, 291, 263; 714/792, 794, 795

(56) References Cited

U.S. PATENT DOCUMENTS

| | | | | | |
|---|---|---|---|---|---|
| 6,012,161 | A | * | 1/2000 | Ariyavisitakul et al. ..... | 714/795 |
| 6,236,645 | B1 | * | 5/2001 | Agazzi ........................ | 370/286 |
| 6,463,041 | B1 | * | 10/2002 | Agazzi ........................ | 370/286 |
| 2002/0107987 | A1 | * | 8/2002 | Malm .......................... | 709/247 |
| 2003/0053531 | A1 | * | 3/2003 | Agazzi ........................ | 375/220 |

OTHER PUBLICATIONS

"A Viterbi Algorithm with Soft–Decision Outputs and its Applications", by J. Hagenauer et al., Proc. of IEEE Globecom. pp. 1680–1686, 1989.

"Improvements In SOVA–Based Decoding for Turbo Codes" by Lang Lin et al., Proc. of IEEE ICC, pp. 1473–1478, 1997.

"On the Equivalence Between SOVA and Max–Log–MAP Decodings" by Fossorier et al., IEEE Comm. Letters, vol. 2, No. 5, pp. 137–139, May 1998.

"An Intuitive Justification and a Simplified Implementation of the MAP Decoder for Convolutional Codes" by Andrew J. Viterbi, IEEE JSAC, vol. 16, No. 2, pp. 260–264, Feb. 1998.

"Optimal Decoding of Linear Codes for Minimizing Symbol Error Rate" by L. R. Bahl et al., IEEE Trans. Info Theory, vol. IT–20, No. 2, pp. 284–287, Mar. 1974.

"A Comparison of Optimal and Sub–Optimal MAP Decoding Algorithms Operating in the Log Domain" by P. Robertson et al., Proc. Of IEEE ICC, pp. 1009–1013, 1995.

U.S. Appl. No. 09/697,467, filed Oct. 26, 2000, "Method and Apparatus for Viterbi Detection of Generalized Partial Response Signals Using Partial Matched Filter and Matched Filter Metrics" by Cideciyan et al.

\* cited by examiner

*Primary Examiner*—Jean B. Corrielus
(74) *Attorney, Agent, or Firm*—Joan Pennington

(57) ABSTRACT

A method and apparatus are provided for implementing soft-input soft-output iterative detectors/decoders. Soft-input information is added directly to incoming channel samples. Input signals comprising the received incoming channel samples with the added soft-input information are detected using a detector trellis. Branch metric terms are transformed to shift all time varying terms with the added soft-input information and some constant terms after an add compare select (ACS) unit. The shifted time varying terms with the added soft-input information and the shifted constant terms are added directly to state metric terms. The soft-input information is added directly to incoming channel samples and the computation of branch metrics is not affected. This allows optimization of a dual-max detector and soft-input soft-output Viterbi detector architectures to minimize hardware complexity and power consumption.

21 Claims, 12 Drawing Sheets

METHOD AND APPARATUS FOR IMPLEMENTING SOFT-INPUT/SOFT-OUTPUT ITERATIVE DETECTORS/DECODERS

FIELD OF THE INVENTION

The present invention relates generally to the data processing field, and more particularly, relates to methods and apparatus for implementing soft-input soft-output iterative detectors/decoders.

DESCRIPTION OF THE RELATED ART

Traditional detectors for signals impaired by inter-symbol interference (ISI) and noise employ maximum likelihood sequence detection (MLSD) based on the Viterbi algorithm (VA). In magnetic storage systems the channel is shaped to a specific polynomial or target response, such as an extended partial-response maximum likelihood (EPRML) $(1-D^2)(1+D)$, or a noise predictive maximum likelihood (NPML) $(1-D^2)(1+p1D^{-1}+p2D^2)$, and the data detector operates on the 8-state or 16-state trellis, respectively. These detectors provide hard-decisions at the output, which are further processed by a decoder to perform error correction.

It is known that using soft decisions in the form of a posteriori probability or likelihood ratios at the output of the detector can provide additional performance gain when utilized by a soft-input decoder. If the decoder also has the capability to provide soft decisions then the detector and decoder operating in an iterative fashion can offer substantial performance improvement. Clearly, in such a system the detector must be able to accept additional soft inputs in the form of a priori probabilities or likelihood ratios.

The class of algorithms that produce symbol reliability information based on recursive computations similar to the Viterbi algorithm are extremely important from an implementation point of view. Such algorithms include a soft-output Viterbi algorithm (SOVA) as described in "A Viterbi Algorithm with Soft-Decision Outputs and its Applications", by J. Hagenauer et al., Proc. of IEEE Globecom. pp. 1680–1686, 1989. Other soft-output Viterbi algorithms are described in "Improvements In SOVA-Based Decoding For Turbo Codes" by Lang Lin et al., Proc. of IEEE ICC, pp. 1473–1478, 1997 and "On the Equivalence Between SOVA and Max-Log-MAP Decodings" by Fossorier et al., IEEE Comm. Letters, vol. 2, no. 5, pp. 137–139, May 1998. "An Intuitive Justification and a Simplified Implementation of the MAP Decoder for Convolutional Codes" by Andrew J. Viterbi, IEEE JSAC, vol. 16, no. 2, pp. 260–264, February 1998 describes a so called dual-max algorithm. The dual-max algorithm is an approximation of the maximum a posteriori (MAP) algorithm know also as the BCJR algorithm as described in "Optimal Decoding of Linear Codes for Minimizing Symbol Error Rate" by L. R. Bahl et al., IEEE Trans. Info Theory, vol. IT-20, no. 2, pp. 284–287, March 1974. When soft input capability in the form of a priori probability or likelihood ratio is included, then the structure of the branch metric computation unit changes. Such a change applies to both forward and backward recursions.

U.S. patent application Ser. No. 09/697,467 filed Oct. 26, 2000 now U.S. Pat. No. 6,377,635 by Cideciyan et al. is entitled "METHOD AND APPARATUS FOR VITERBI DETECTION OF GENERALIZED PARTIAL RESPONSE SIGNALS USING PARTIAL MATCHED FILTER AND MATCHED FILTER METRICS" and assigned to the present assignee. Methods and apparatus are disclosed for implementing high-speed and area efficient architectures for Viterbi detection of generalized partial response signals using both partial matched filter and matched filter metrics. In the disclosed method, branch metric terms are transformed to shift all time varying terms and some constant terms after an add compare select (ACS) unit. The total number of non-zero constants on trellis branches is minimized. The shifted time varying terms and the shifted constant terms are added directly to state metric terms. The time varying terms are expressed as outputs $Z_n$ of a partial matched filter or as outputs $W_n$ of a matched filter. For a given generalized partial response target, the time-invariance property of the Viterbi detector enables identifying the minimum number of non-zero constants on trellis branches without resorting to heuristics. The time-invariance property holds for Viterbi detectors that process multiple samples per trellis-branch, thus allowing implementations at any desired speed.

A need exists for a method and apparatus for soft-input soft-output iterative detectors/decoders. It is desirable to provide such method and apparatus for soft-input soft-output iterative detectors/decoders that provide enhanced performance substantially without negative effect.

SUMMARY OF THE INVENTION

A principal object of the present invention is to provide methods and apparatus for soft-input soft-output iterative detectors/decoders. Other important objects of the present invention are to provide such methods and apparatus for soft-input soft-output iterative detectors/decoders substantially without negative effect and that overcome many of the disadvantages of prior art arrangements.

In brief, a method and apparatus are provided for implementing soft-input soft-output iterative detectors/decoders. Soft-input information is added directly to incoming channel samples. Input signals from the received incoming channel samples with the added soft-input information are detected using a detector trellis. Branch metric terms are transformed to shift all time varying terms with the added soft-input information and some constant terms after an add compare select (ACS) unit. The shifted time varying terms with the added soft-input information and the shifted constant terms are added directly to state metric terms.

In accordance with features of the invention, the soft-input information is added directly to incoming channel samples and the computation of branch metrics is not affected. This allows optimization of a dual-max detector and soft-input soft-output Viterbi detector architectures to minimize hardware complexity and power consumption.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
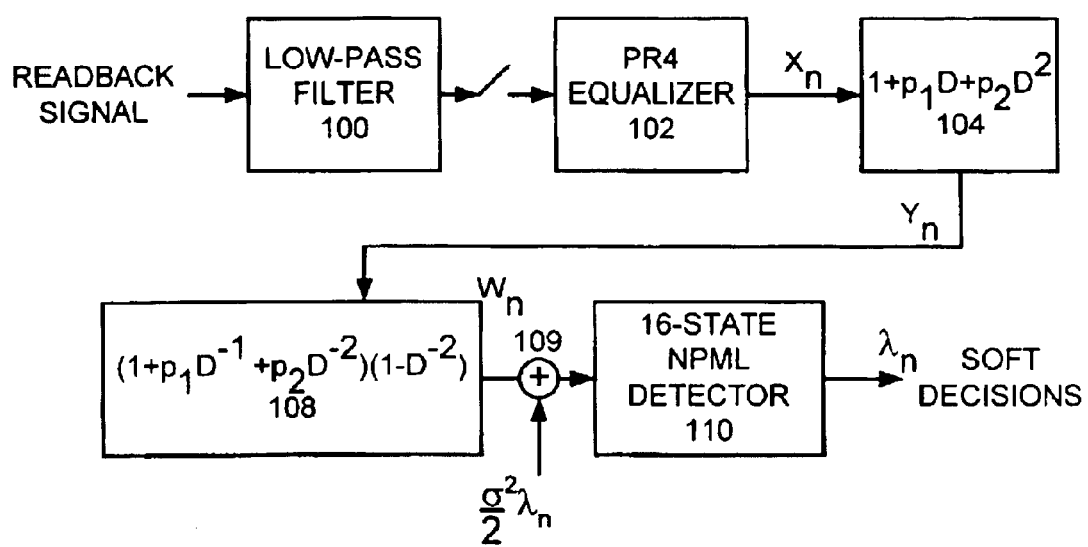
FIG. 1 is a block diagram representation illustrating a generalized partial-response data channel including a noise predictive maximum likelihood (NPML) 16-state soft-input soft-output detector for partial response class 4 (PR4) equalized signals using a matched filter metric in accordance with the preferred embodiment.

In accordance with features of the invention, a general methodology is provided for implementing soft-input soft-output iterative detectors/decoders. In accordance with a method of the present invention, the soft input is added directly to the incoming channel samples and does not affect the computation of branch metrics. By using certain time-invariance property of the state metrics of the trellis together with the distributive law min(a+x, b+x)=min(a, b)+x the time-varying terms of the branch metrics can be shifted to the output of the add-compare-select (ACS) units and also minimize the total number of non-zero constants on the trellis branches. For a given generalized partial response target the time-invariance property guarantees that the minimum number of non-zero constants associated with the branch adders is found as a result of systematic search without resorting to heuristics.

Additionally, in accordance with the present invention, the a priori symbol reliability information can also be shifted to the output of the ACS unit together with the time-varying terms that depend on the channel output. The present invention allows optimization of both dual-max detector and soft-input/soft-output Viterbi detector architectures to achieve substantial reduction in hardware complexity and power consumption.

The application of the general methodology of the invention is illustrated with specific embodiments related to noise-predictive maximum-likelihood (NPML) detection with soft-input soft-output capability where the corresponding trellis operates on a T or 2T basis, and extended partial response class 4 (EPR4) targets with a soft-input/soft-output Viterbi detector operating on a T or 2T basis, where 1/T is the sample rate. Furthermore, the general methodology of the invention in the case of a dual-max procedure that encompasses forward as well as backward recursions. The application of this detector architecture to serial concatenation with convolutional and low density parity check (LDPC) codes are illustrated.

The soft-input/soft-output sequence detection algorithms are modifications of the Viterbi algorithm that incorporate soft a priori reliability information and produce soft a posteriori reliability information in the form of probabilities or likelihood ratios. These algorithms and their variations can be described on a trellis corresponding to the finite state machine (FSM) representation of the intersymbol interference channel. Let the channel memory be represented by a FSM, with the state at time n−1 denoted by s' and at time n by s. The Viterbi algorithm with soft a priori reliability information is described by the following recursive equation:

$$M_n(s) = \max_{s'}\{M_{n-1}(s') + c_n(s', s)\} \quad (1)$$

Where $M_n(s)$ are the state metrics at time n, and $c_n(s',s)$ are the branch metrics. Consider a generalized partial response (PR) shaped signal in the presence of noise, that is:

$$y_n = a_n + \sum_{i=1}^{L} f_i a_{n-i} + \eta_n \quad (2)$$

where $a_n$ is the data symbol at time nT, $F(D)=(1+f_1 D+f_2 D^2+ \ldots +f_L D^L)$ is the generalized PR polynomial and $\eta_n$ is the noise sample at the input of the detector with variance $\sigma^2$, the branch metric $c_n(s',s)$ is given by:

$$c_n(s', s) = -\left\{y_n - \left(a_n + \sum_{i=1}^{L} f_i a_{n-i}\right)\right\}^2 + 2\sigma^2 \ln P(a_n) \quad (3)$$

while the states at time n−1 and n are given by $s'=a_{n-L} \ldots, a_{n-i}$ and $s=a_{n-L+1} \ldots, a_n$. Note that in the case of additive noise with another non-Gaussian distribution the metric in equation (3) can be easily reformulated. The Viterbi detector operating on $y_n$ and the a priori probability $P(a_n)$ of the independent recorded symbols $a_n$ will find the sequence $\{â_n\}$ that minimizes the following metric:

$$J = -\sum_n c_n(s', s) \quad (4)$$

$$= \sum_n \left\{\left\{y_n - \left(a_n + \sum_{i=1}^{L} f_i a_{n-i}\right)\right\}^2 - 2\sigma^2 \ln P(a_n)\right\}$$

Applying the time-invariance property to the first summation term in equation (4) one obtains an equivalent metric:

$$J = -\sum_n a_n\left(y_n + \sum_{i=1}^{L} f_i y_{n+i}\right) + \sum_n \left(\sum_{i=1}^{L} f_i a_n a_{n-i} + \sum_{i=1}^{L-1}\sum_{j>i}^{L} f_i f_j a_{n-i} a_{n-j}\right) - \sigma^2 \sum_n \ln P(a_n) \quad (5)$$

Let $$W_n = y_n + \sum_{i=1}^{L} f_i y_{n+i} \quad (6)$$

$W_n$ represents the output of a filter matched to the generalized PR channel polynomial. Substituting equation (6) into equation (5), the following transformed metric is obtained:

$$J = -\sum_n a_n W_n + \sum_n \left(\sum_{i=1}^{L} f_i a_n a_{n-i} + \sum_{i=1}^{L-1}\sum_{j>i}^{L} f_i f_j a_{n-i} a_{n-j}\right) - \sigma^2 \sum_n \ln P(a_n) \quad (7)$$

The above transformed metric is such that the channel output dependent term and the a priori probability term of the branch metric, that is $a_n W_n$ and $\sigma^2 \ln P(a_n)$ can be shifted after the ACS unit, leaving only constants on the trellis branches. It can be shown that:

$$2 \ln P(a_n) - \ln \{P(a_n=-1)P(a_n=+1)\} = a_n \lambda_n \quad (8)$$

where, $$\lambda_n = \ln \{P(a_n=+1)/P(a_n=-1)\} \quad (9)$$

is the log-likelihood ratio of the symbol a priori probabilities. Therefore by adding the constant term $(\sigma^2/2)\Sigma$ ln $\{P(a_n=-1)P(a_{n=+1})\}$ n to the right-hand side of equation (7), we obtain the equivalent metric:

$$J = -\sum_n a_n W_n + \sum_n \left(\sum_{i=1}^{L} f_i a_n a_{n-i} + \sum_{i=1}^{L-1}\sum_{j>i}^{L} f_i f_j a_{n-i} a_{n-j}\right) - (\sigma^2/2)\sum_n a_n \lambda_n \quad (10)$$

Equation (10) can be further expressed as:

$$J = -\sum_n a_n(W_n + (\sigma^2/2)\lambda_n) + \sum_n \left(\sum_{i=1}^{L} f_i a_n a_{n-i} + \sum_{i=1}^{L-1}\sum_{j>i}^{L} f_i f_j a_{n-i} a_{n-j}\right) \quad (11)$$

By applying the time-invariance property on the second term in equation (11) we arrive at another equivalent realization of the metric referred to as the matched filter metric, that is:

$$J = -\sum_n a_n(W_n + (\sigma^2/2)\lambda_n) + \sum_n \left(a_n \sum_{i=1}^{L} s_i a_{n-i}\right) \quad (12)$$

where $s_i = 1, 2, \ldots, L$ are the one sided coefficients of the autocorrelation function of the generalized PR polynomial $F(D)$, that is:

$$s_i = f_i + \sum_{j=1}^{i+j\leq L} f_j f_{i+j}, \quad i = 1, 2, \ldots, L \quad (13)$$

Note that the first summation term in equation (12) depends on the channel sample and the a priori log-likelihood ratio and is known as the time-varying component of the branch metric. The second summation term depends only on data symbols and is known as the constant component of the branch metric. The transformed metric in equation (12) is such that the time-varying term, that is $W_n + (\sigma^2/2)\lambda_n$ can be shifted after the ACS unit, leaving only constants on the trellis branches.

Having reference now to the drawings, in FIG. 1, there is shown a generalized partial-response data channel of the preferred embodiment generally designated by the reference character 100. As shown in FIG. 1, a readback signal is applied to a low pass filter 102 and applied to a PR4 equalizer 104. The PR4 equalizer 104 is followed by a whitening/predictor filter $1+p1D+p2D^2$ 106, a matched filter $(1-D^{-2})(1+p1D^{-1}+p2D^{-2})$ 108, and a corresponding 16-state noise-predictive maximum-likelihood (NPML) detector 110. The output of PR4 equalizer 104 is an equalized signal $x_n$. The output of the whitening/predictor filter $1+p1D+p2D^2$ 106 is the whitened output $y_n$. The matched-filter $(1-D^{-1})(1+p1D^{-1}+p2D^{-2})$ 108 facilitates the transformation of the trellis according to the metric in equation (12) providing an output $W_n$. A soft-input, a priori log-likelihood term $(\sigma^2/2)\lambda n$ is added by an adder 109 at the output of the matched filter 108. The NPML detector target with 2 predictor coefficients, that is, L=4, is given by $F(D)=(1-D^2)(1+p1D+p2D^2)$. This target gives rise to a 16-state trellis. The 16-state NPML detector 110 provides output decisions $\lambda_n$. For NPML detectors with two predictor coefficients and a transformed metric as in equation (12), we obtain, $$s_1 = p_1(p2+1),$$

$$s_2 = -(1-p_2)^2 - p_1^2$$

$$s_3 = -p_1(p_2+1),$$

$$s4 = -p_2 \quad (14)$$

Figure 2:
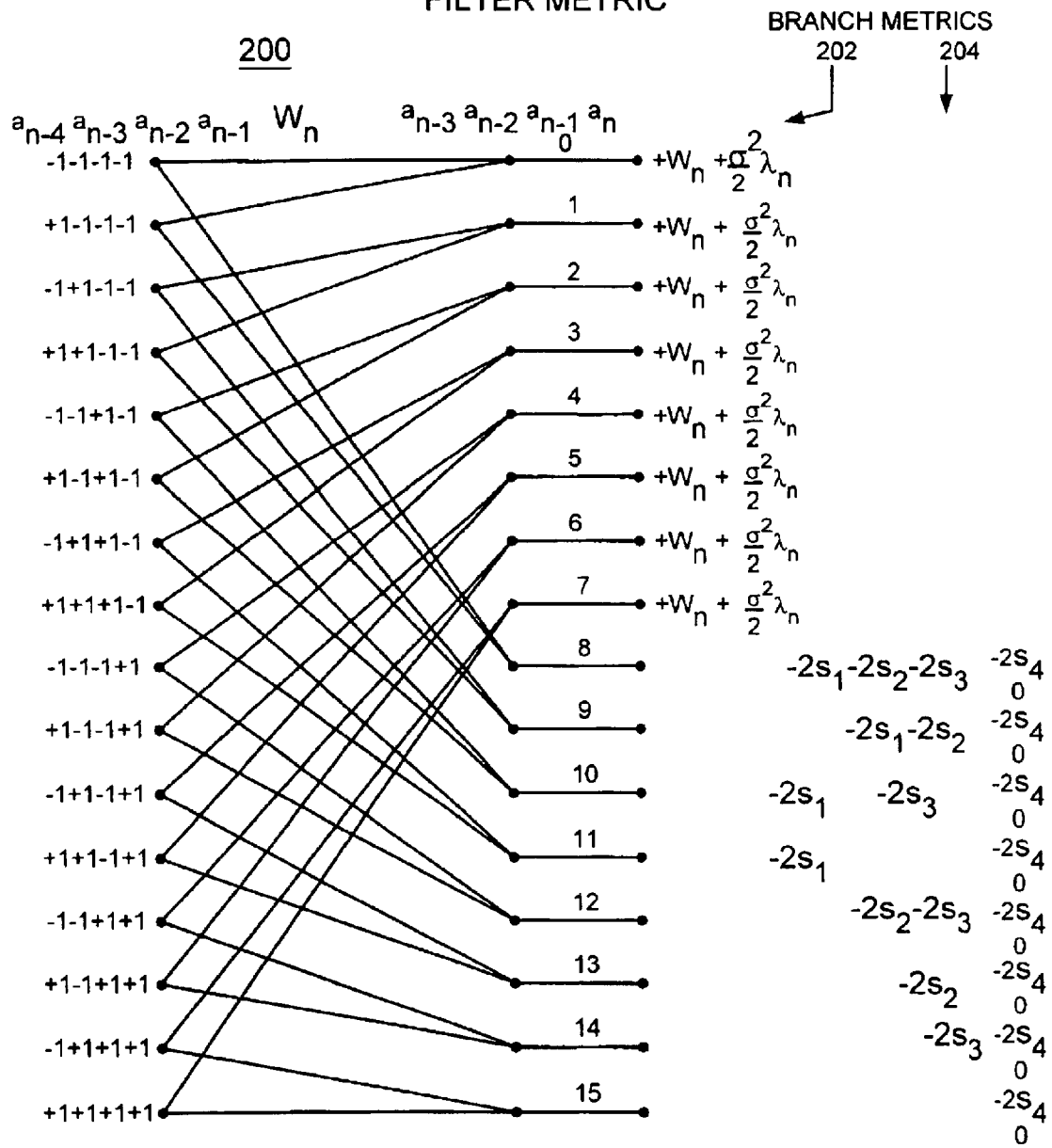
FIG. 2 illustrates an equivalent NPML 16-state T-trellis with soft-input reliability information and matched filter metric in accordance with the preferred embodiment.

FIG. 2 illustrates an equivalent NPML 16-state T-trellis with soft-input reliability information and matched filter metric in accordance with the preferred embodiment generally designated by the reference character 200. Transitioning through the trellis 200 from time nT represented by the nodes on the left hand side of the trellis to time (n+1)T represented by the nodes on the right hand side of the trellis, Add-Compare-Select (ACS) operations are performed to find the updated state metric. As shown in FIG. 2, NPML 16-state trellis with partial matched filter metric 200 includes 16 nodes or states and 32 branches connecting the 16 states together between time steps. The values $a_{n-4}a_{n-3}a_{n-2}a_{n-1}$ and $a_{n-3}a_{n-2}a_{n-1}a_n$ are the trellis states (0–15) at times nT and (n+1)T, respectively. On the right side of the trellis, branch metric time-varying term, that is $W_n+(\sigma^2/2)\lambda_n$ 202 and branch metric constant terms (combinations of $s_1, s_2, s_4$) 204 are shown. The output $W_n$ of partial matched-filter $(1-D^{-1})(1+p1D^{-1}+p2D^{-2})$ 108 is shown above the trellis. FIG. 2 shows the resulting 16-state trellis with only 8 branch adders instead of 32. There are 8 additions with the time-varying term $W_n+(\sigma^2/2)\lambda_n$ 202 and 6 additions with constant terms following the ACS unit.

Another significant hardware simplification can be obtained by setting the noise variance to 1, that is $\sigma=1$. Simulation results have shown that this simplification does not incur a performance loss. Soft a posteriori reliability information at the output of the NPML detector 110 can be obtained according to any of the soft-output Viterbi algorithm (SOVA) variants.

Figure 3:
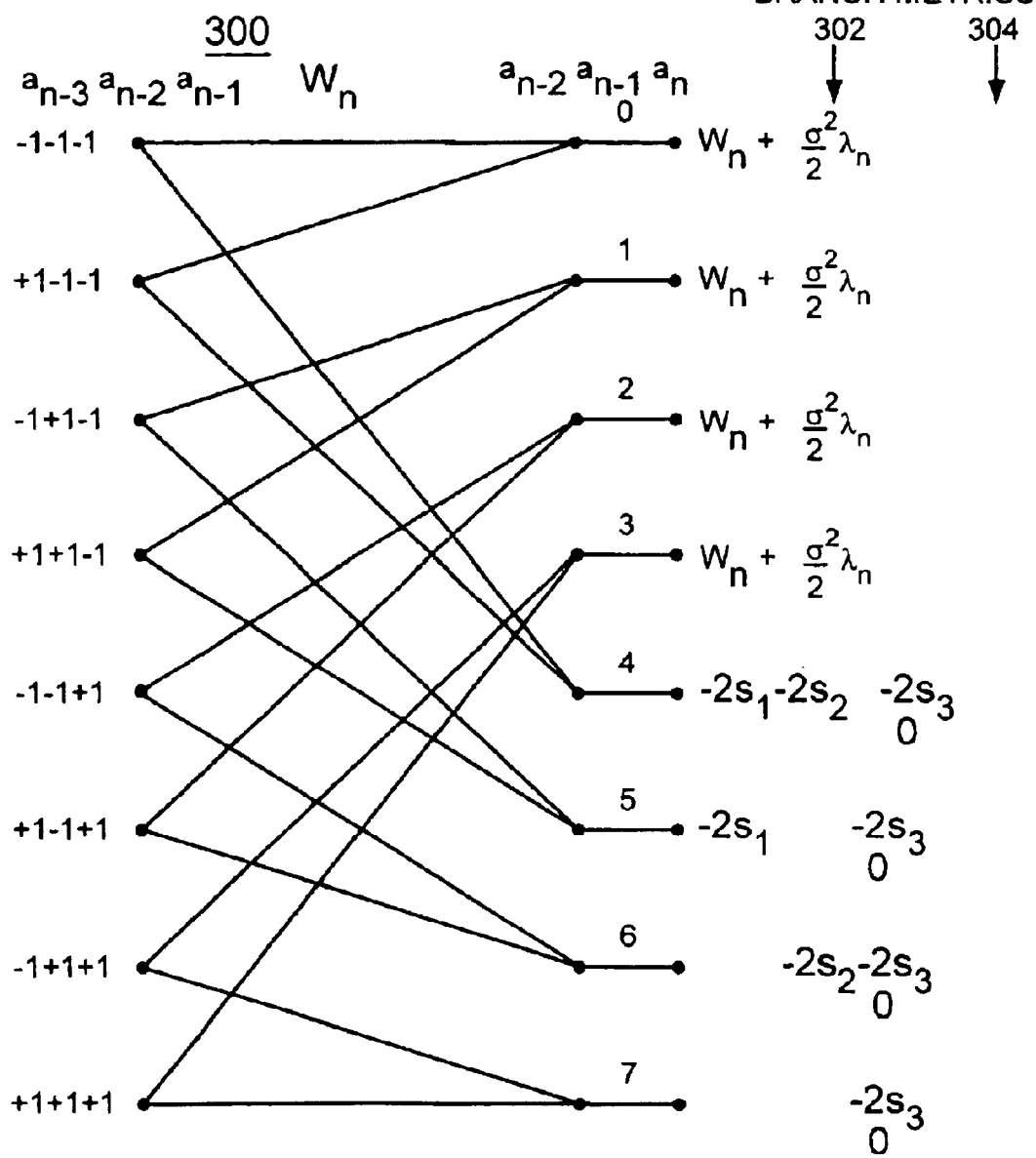
FIG. 3 illustrates an equivalent extended partial-response maximum likelihood (EPRML) 8-state T-trellis with soft-input reliability information and matched filter metric in accordance with the preferred embodiment.

FIG. 3 illustrates an equivalent extended partial-response maximum likelihood (EPRML) 8-state T-trellis with soft-input reliability information and matched filter metric in accordance with the preferred embodiment generally designated by the reference character 300. The EPR4 detector target is given by $F(D)=(1-D^2)(1+D)=(1+D-D^2-D^3)$. This target gives rise to an 8-state trellis. An equivalent metric realization can be obtained by applying a full matched-filter transformation to both terms of the metric in equation (5). By applying the time-invariance transformation and incorporating soft-input a priori information into the EPRML sequence detector we obtain the following equivalent matched-filter metric:

$$J = -\sum_n a_n W_n + \sum_n \left(a_n \sum_{i=1}^{3} s_i a_{n-i}\right) - (\sigma^2/2)\sum_n a_n \lambda_n \quad (15)$$

where, $s_1=1$, $s_2=-2$, $s_3=-1$. This allows us to express equation (15) as $$J = -\sum_n a_n(W_n + (\sigma^2/2)\lambda_n) + \sum_n \left(a_n \sum_{i=1}^{3} s_i a_{n-i}\right) \quad (16)$$

The above transformed metric is such that the time-varying term, $W_n+(\sigma^2/2)\lambda_n$, can be shifted after the ACS unit, leaving only constants on the trellis branches. FIG. 3 shows the resulting 8-state trellis of a EPRML detector with soft-input reliability information. This trellis requires only 4 branch adders instead of 16. There are 4 additions with the time-varying term 302 $W_n+(\sigma^2/2)\lambda_n$ and 3 additions with constant terms 304 following the ACS unit. Another significant hardware simplification can be obtained by setting the noise variance to 1, that is $\sigma=1$. Simulation results have shown that this simplification does not incur a performance loss. Soft a posteriori reliability information at the output of the NPML detector can be obtained according to any of the SOVA variants.

Soft-input soft-output sequence detectors of the present invention also are used with 2T processing. High data rates may necessitate processing of multiple samples per trellis branch. The concept of time invariance of the state metrics can be used so that the soft input is added directly to the incoming channel samples and does not affect the computation of branch metrics in the case of processing two samples per trellis branch. The extension of this concept to processing any number of samples per trellis branch is straightforward. A Viterbi detector with soft a priori reliability information and operating on two samples at a time, $y_{2n}$, $y_{2n+1}$, will find the sequence $\{â_n\}$ that minimizes the following metric:

$$J = -\sum_n y_{2n}\left(a_{2n} + \sum_{i=1}^{L} f_i a_{2n-i}\right) - \sum_n y_{2n+1}\left(a_{2n+1} + \sum_{i=1}^{L} f_i a_{2n+1-i}\right) + \quad (17)$$

$$\sum_n \left(\sum_{i=1}^{L} f_i a_{2n} a_{2n-i} + \sum_{i=1}^{L-1}\sum_{j>i}^{L} f_i f_j a_{2n-i} a_{2n-j}\right) +$$

$$\sum_n \left(\sum_{i=1}^{L} f_i a_{2n+1} a_{2n+1-i} + \sum_{i=1}^{L-1}\sum_{j>i}^{L} f_i f_j a_{2n+1-i} a_{2n+1-j}\right) -$$

$$\sigma^2 \sum_n \ln P(a_{2n}) - \sigma^2 \sum_n \ln P(a_{2n+1})$$

Using equation (9) in equation (17), adding constant terms $$(\sigma^2/2)\sum_n \ln\{P(a_{2n}=-1)P(a_{2n}=+1)\}, \text{ and}$$

$$(\sigma^2/2)\sum_n \ln\{P(a_{2n+1}=-1)P(a_{2n+1}=+1)\},$$

we obtain the equivalent metric:

$$J = -\sum_n y_{2n}\left(a_{2n} + \sum_{i=1}^{L} f_i a_{2n-i}\right) - \sum_n y_{2n+1}\left(a_{2n+1} + \sum_{i=1}^{L} f_i a_{2n+1-i}\right) + \quad (18)$$

$$\sum_n \left(\sum_{i=1}^{L} f_i a_{2n} a_{2n-i} + \sum_{i=1}^{L-1}\sum_{j>i}^{L} f_i f_j a_{2n-i} a_{2n-j}\right) +$$

$$\sum_n \left(\sum_{i=1}^{L} f_i a_{2n+1} a_{2n+1-i} + \sum_{i=1}^{L-1}\sum_{j>i}^{L} f_i f_j a_{2n+1-i} a_{2n+1-j}\right) -$$

$$(\sigma^2/2)\sum_n (a_{2n}\lambda_{2n}) - (\sigma^2/2)\sum_n (a_{2n+1}\lambda_{2n+1})$$

Figure 4:
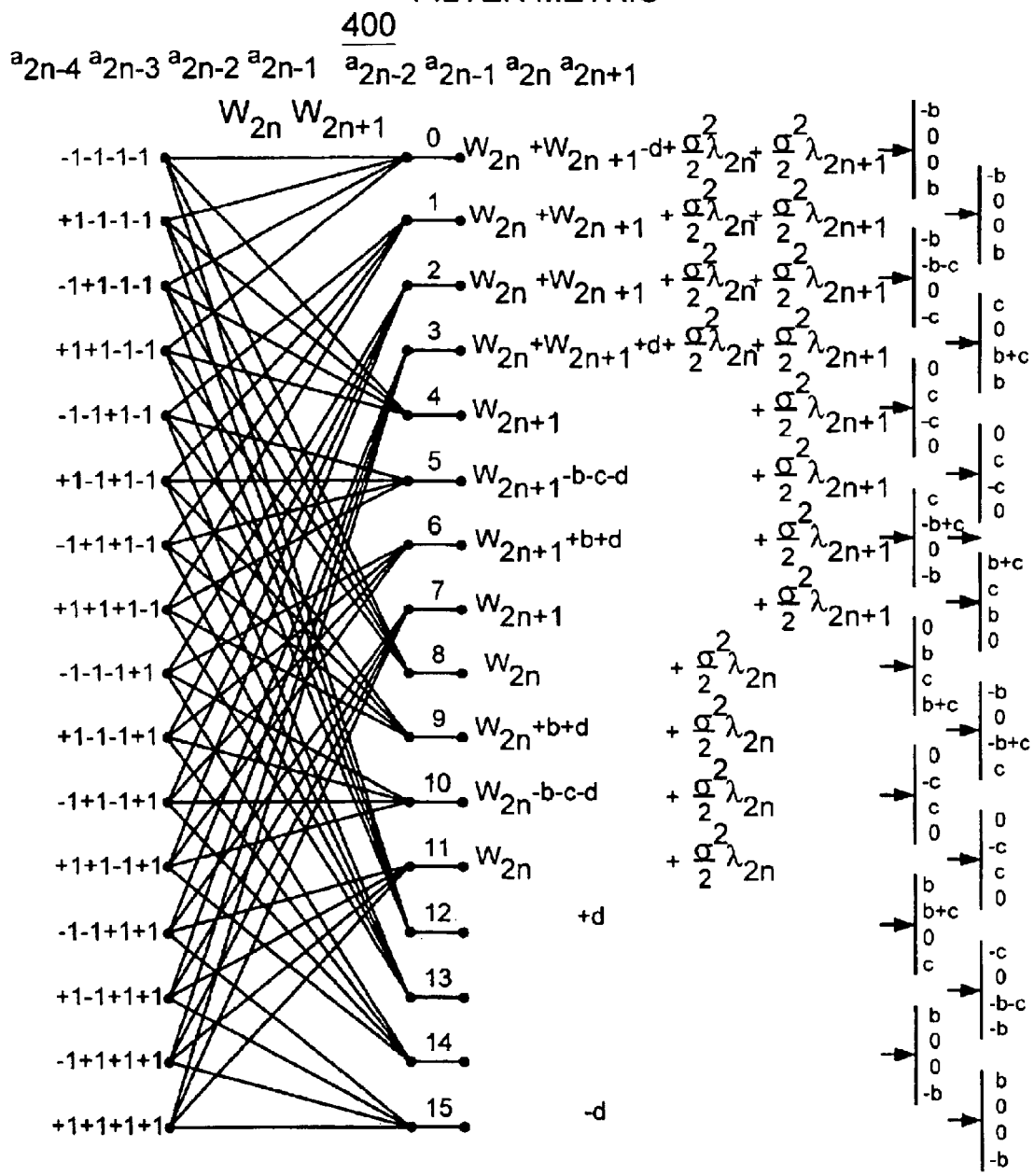
FIG. 4 illustrates an equivalent NPML 16-state 2T-trellis with soft-input reliability information and matched filter metric in accordance with the preferred embodiment.

FIG. 4 illustrates an equivalent NPML 16-state 2T-trellis with soft-input reliability information and matched filter metric in accordance with the preferred embodiment generally designated by the reference character 400. A 16-state NPML detector with soft-input reliability information operating on two samples, $y_{2n}$, $y_{2n+1}$, at a time, will find the sequence $\{â_n\}$ that according to equation (18) minimizes the following metric:

$$J = -\sum_n \{a_{2n}(W_{2n} + (\sigma^2/2)\lambda_{2n}) + (a_{2n+1}(W_{2n+1} + (\sigma^2/2)\lambda_{2n+1})\} + \quad (19)$$

$$\sum_n (s_1 a_{2n} a_{2n-1} + s_2 a_{2n} a_{2n-2} + s_3 a_{2n} a_{2n-3} + s_4 a_{2n} a_{2n-4} +$$

$$s_1 a_{2n-1} a_{2n-2} + s_2 a_{2n+1} a_{2n-1} + s_3 a_{2n-1} a_{2n-4} + s_4 a_{2n+1} a_{2n-3}\}$$

FIG. 4 shows the 16-state trellis 400 corresponding to the target $(1-D^2)(1+p1D+p2D^2)$ and the metric in equation (19). In FIG. 4 the constants b, c, d are given by:

$b=s_1-s_4$ $c=s_1+s_4$ $c=-s_1-s_2$

The trellis 400 in FIG. 4 requires only 40 branch adders instead of 64. There are 12 additions with time-varying terms that include the soft-input reliability information and additions with constant terms following the ACS unit. Note that the use of soft-input reliability information did not change the basic trellis structure nor the computation of the branch constants. Another significant hardware simplification can be obtained by setting the noise variance to 1, that is σ=1. Simulation results have shown that this simplification does not incur a performance loss. Soft a posteriori reliability information at the output of the NPML detector can be obtained according to any of the SOVA variants.

Figure 5:
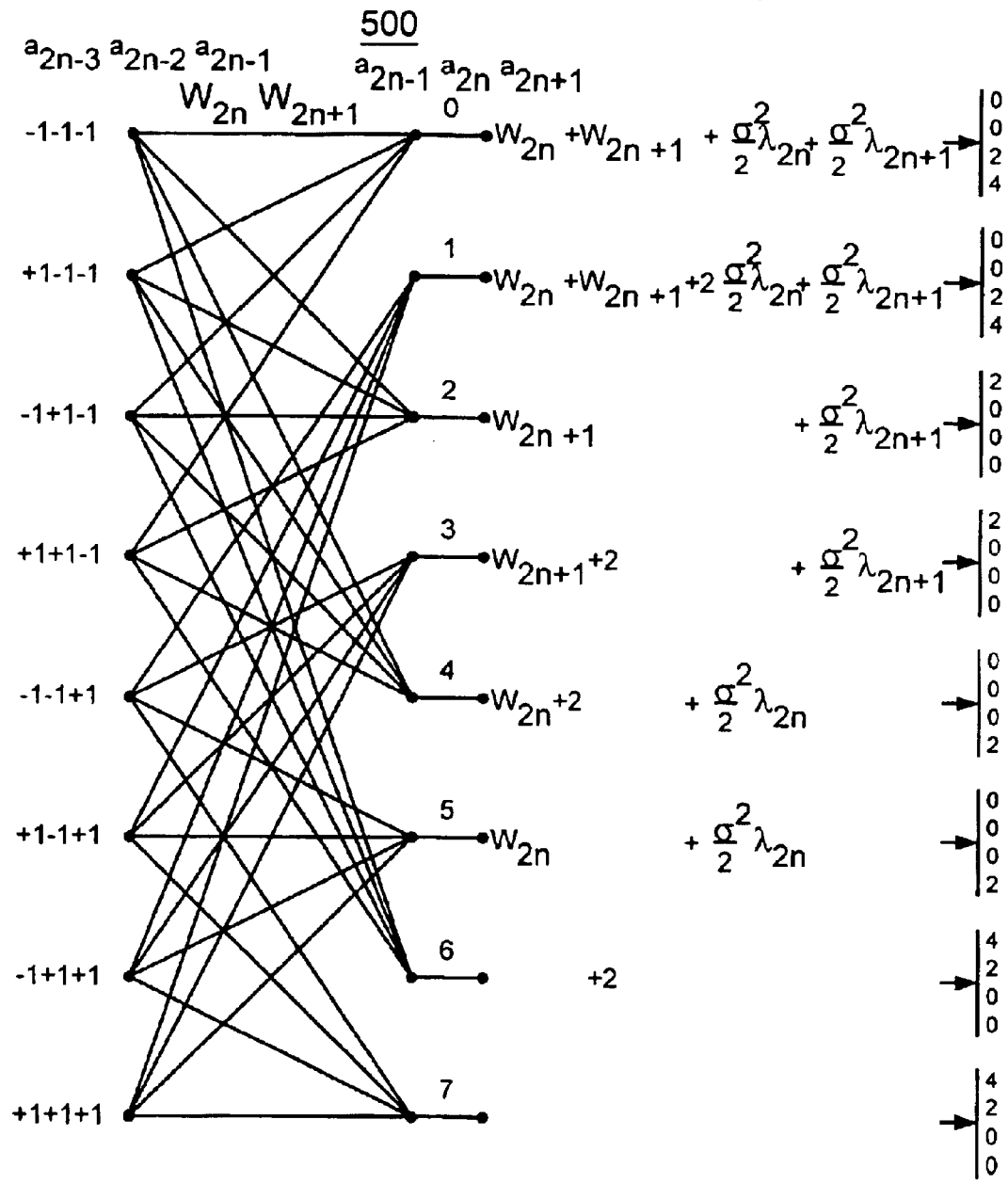
FIG. 5 illustrates an EPR4 2T-trellis with soft-input reliability information and matched filter metric in accordance with the preferred embodiment.

FIG. 5 illustrates an EPR4 2T-trellis with soft-input reliability information and matched filter metric in accordance with the preferred embodiment generally designated by the reference character 500. With the EPR4 target the Viterbi detector with soft-input reliability information operating on two samples, $y_{2n}$, $y_{2n+1}$, at a time, will minimize the following metric:

$$J = -\sum_n \{y_{2n}(a_{2n} + a_{2n-1} - a_{2n-2} - a_{2n-3}) + \quad (21)$$

$$y_{2n+1}(a_{2n+1} + a_{2n} - a_{2n-1} - a_{2n-2})\} +$$

$$\sum_n (-2a_{2n}a_{2n-2} - a_{2n}a_{2n-3} - a_{2n-1}a_{2n-3} + a_{2n-2}a_{2n-3} +$$

$$a_{2n+1}a_{2n} - a_{2n+1}a_{2n-1} - a_{2n+1}a_{2n-2}) -$$

$$\sigma^2 \sum_n \ln P(a_{2n}) - \sigma^2 \sum_n \ln P(a_{2n+1})$$

Applying the time-invariance property to the first two summation terms in (21) we obtain:

$$J = -\sum_n \{y_{2n}W_{2n} + y_{2n+1}W_{2n+1}\} + \quad (22)$$

$$\sum_n (-2a_{2n}a_{2n-2} - a_{2n}a_{2n-3} - a_{2n+1}a_{2n-1} + a_{2n-2}a_{2n-3} + a_{2n+1}a_{2n} -$$

$$a_{2n+1}a_{2n-2}) - \sigma^2 \sum_n \ln P(a_{2n}) - \sigma^2 \sum_n \ln P(a_{2n+1})$$

where $W_{2n}=y_{2n}+y_{2n+1}-y_{2n+2}-y_{2n+3}$ can be interpreted as the output of a matched-filter with a response matched to $(1-D^2)(1+D)$. FIG. 5 shows the 8-state transformed trellis 500 with two samples per branch that minimizes the equivalent metric of equation (22). Note that in all cases the time-varying terms of the branch metrics that include the soft-input reliability information are added at the output of the ACS units and that there are only 12 non-zero branch constants out of the maximum 32 possible ones. Soft a posteriori reliability information at the output of the NPML detector can be obtained according to any of the SOVA variants.

A sub-optimal detector approach known as the dual-maxima algorithm can be obtained from the maximum a posteriori (MAP) soft-output detector by using the standard approximation:

$$\ln \sum_j \exp a_j \sim \max_j a_j \quad (23)$$

which simplifies the forward and backward recursions and the log-likelihood ratio computation in the MAP detector. Applying equation (23) to the log-likelihood ratio computation provides:

$$\Lambda_n = \max_{s,s':a_n=+1}\{A_{n-1}(s') + E_n(s) + c_n(s',s)\} - \quad (24)$$

-continued
$$\max_{s,s':a_n=-1}\{A_{n-1}(s') + E_n(s) + c_n(s',s)\}$$

where $\Lambda_n$ is an approximation of the a posteriori log-likelihood ratio at time n $\ln \{P(a_n=+1|\underline{y})/(a_n=+1|\underline{y})\}$ given the channel output samples $\underline{y}=y_0, \ldots, y_{N-1}$ and where $A_n(s')$ and $E_n(s)$ are called the forward and backward state metrics, respectively. The recursive algorithm computes in a forward pass $$A_n(s) = \max_{s'}\{A_{n-1}(s') + c_n(s',s)\} \quad (25)$$

and in a backward pass.

$$E_{n-1}(s') = \max_{s}\{E_n(s) + c_n(s',s)\} \quad (26)$$

For a terminated trellis, the initial conditions for the forward pass are $A_0(s)=0$ and $A_0(s)=-\infty$, s≠0 and for the backward pass are $E_N(s)=0$ and $E_N(s)=-\infty$, s≠0 and where N is the length of the terminated trellis. In certain cases such as, for example, non-terminated ISI trellis, the initial state metrics for the backward pass are $E_N(s)=-\ln 2^L$, where L is the memory of the ISI channel, and N is the length of the block of channel output samples processed together by the dual-max detector.

Figure 6:
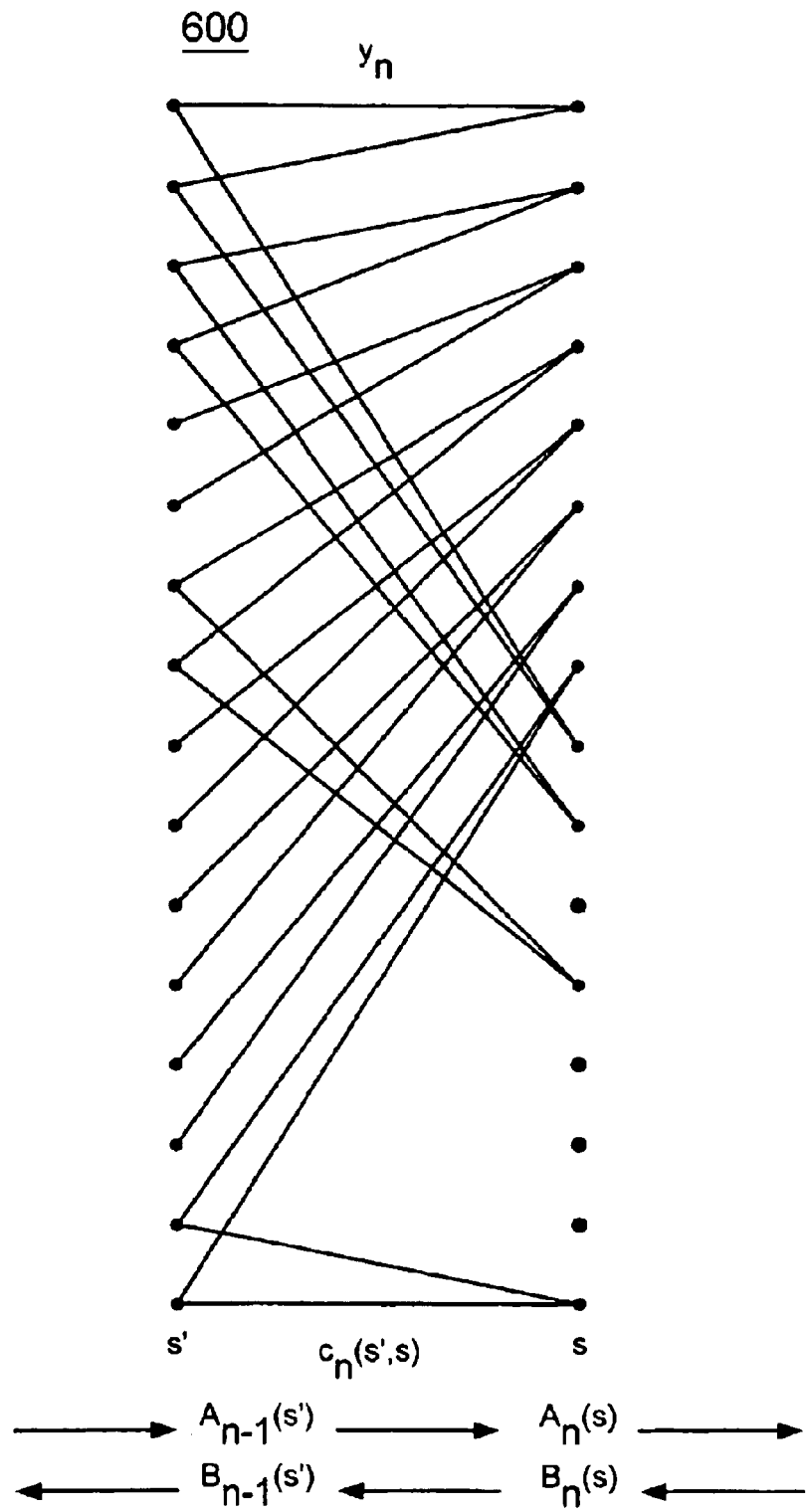
FIG. 6 illustrates a section of a trellis on which a dual-max algorithm operates together with relevant forward and backward state metrics in accordance with the preferred embodiment.

FIG. 6 illustrates a section of a trellis on which a dual-max algorithm operates together with relevant forward and backward state metrics in accordance with the preferred embodiment generally designated by the reference character 600. For a generalized partial response (PR) shaped signal $y_n$ in the presence of noise, that is:

$$y_n = a_n + \sum_{i=1}^{L} f_i a_{n-i} + \eta_n \quad (27)$$

Where $a_n$ is the data symbol at time nT, $F(D)=(1+f1D+f2D^2+\ldots+fLD^L)$ is the a generalized PR polynomial and is the noise sample at the input of the detector with variance, the branch metric is given by:

$$c_n(s',s) = -\left\{y_n - \left(a_n + \sum_{i=1}^{L} f_i a_{n-i}\right)\right\}^2 + 2\sigma^2 \ln P(a_n) \quad (28)$$

The dual-max detector, operating on a block of N channel output samples, $\underline{y}=y_n, \ldots, y_{n+N-1}$, and the a priori probabilities $P(a_n), \ldots, P(a_{n+N-1})$, of the independent recorded symbols $a_n, \ldots, a_{n+N-1}$ estimates the log-likelihood ratio $\Lambda_n$ by using equation (24). Following the same metric transformations as above for soft-input soft-output sequence detectors for T-processing, we obtain the equivalent forward and backward recursions $$\tilde{A}_n(s) = \min_{s'}\left\{\tilde{A}_{n-1}(s') - a_n W_n + \quad (29)\right.$$

$$\left.\left(\sum_{i=1}^{L} f_i a_n a_{n-i} + \sum_{i=1}^{L-1}\sum_{j>i}^{L} f_i f_j a_{n-i} a_{n-j}\right) - \sigma^2 \ln P(a_n)\right\}$$

-continued $$\tilde{E}_n(s) = \min_s \left\{ \tilde{E}_n(s) - a_n W_n + \left( \sum_{i=1}^{L} f_i a_n a_{n-i} + \sum_{i=1}^{L-1} \sum_{j>i}^{L} f_i f_j a_{n-i} a_{n-j} \right) - \sigma^2 \ln P(a_n) \right\} \quad (30)$$

where $\tilde{A}_n(s)$ and $\tilde{E}_n(s)$ are equivalent forward and backward state metrics, respectively, obtained by dropping the term $y_n^2$ common to all branches, dividing the remaining branch metric by a factor two, and changing the sign of the resulting branch metric to allow the recursions to be expressed using minimization. For NPML detectors with 2 predictor coefficients and matched filter transformation, equation (29) and equation (30) become:

$$\tilde{A}_n(s) = \min_{s'} \left\{ \tilde{A}_{n-1}(s') - a_n W_n + a_n \left( \sum_{i=1}^{4} s_i a_{n-i} - (\sigma^2/2) a_n \lambda_n \right) \right\} \quad (31)$$

$$\tilde{E}_{n-1}(s') = \min_s \left\{ \tilde{E}_n(s) - a_n W_n + a_n \left( \sum_{i=1}^{4} s_i a_{n-i} - (\sigma^2/2) a_n \lambda_n \right) \right\} \quad (32)$$

where $s_1, s_2, s_3, s_4$ are given in equation (14). The computation of the a posteriori log-likelihood ratio is now given by:

$$\Lambda_n = 2 \times \left\{ \max_{s:a_n=+1} \{\tilde{A}_n(s) + \tilde{E}_n(s)\} - \max_{s:a_n=-1} \{\tilde{A}_n(s) + \tilde{E}_n(s)\} \right\} \quad (33)$$

where the factor two accounts for the division by a factor two in equation (29) and equation (30).

Figure 7:
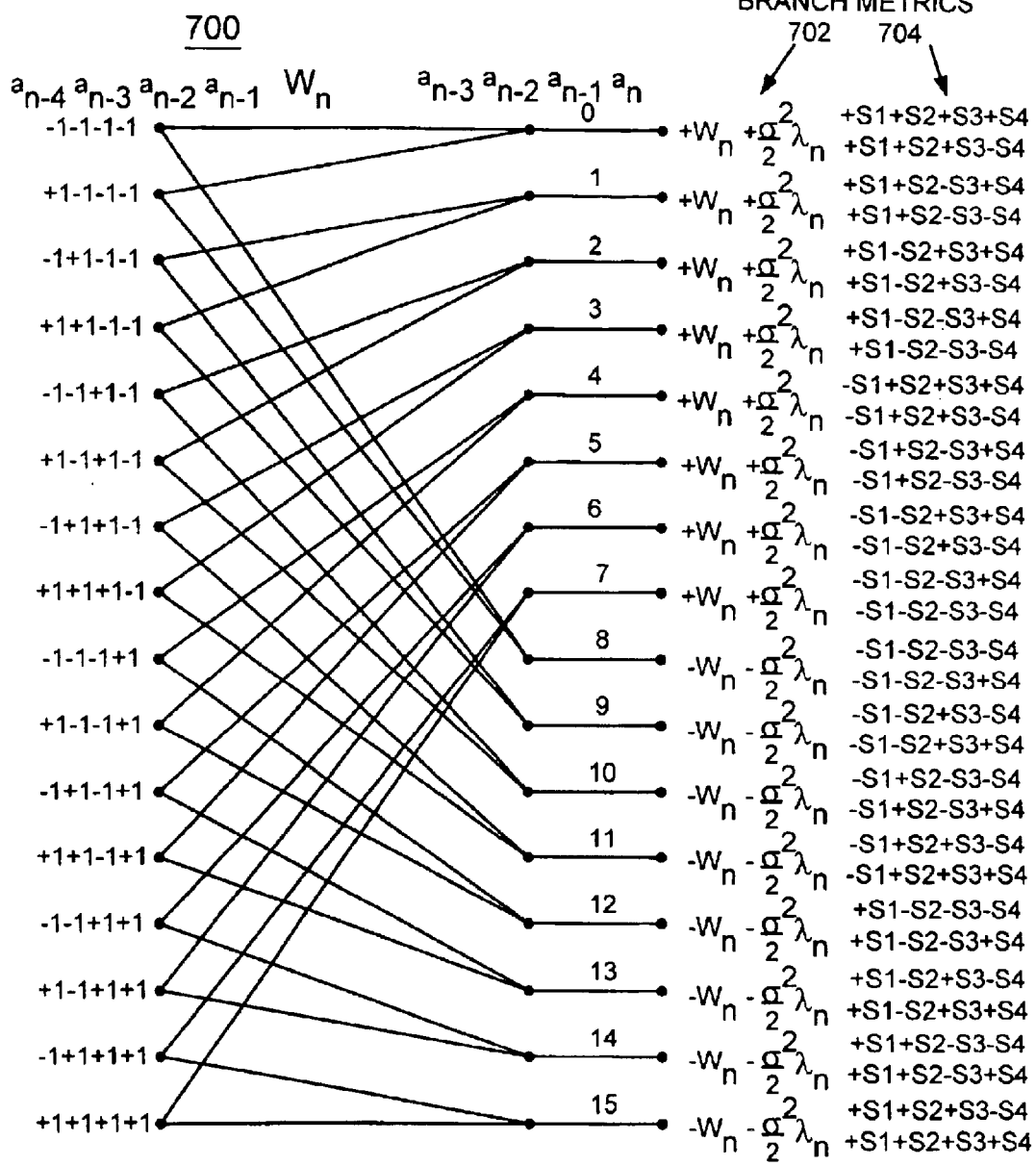
FIG. 7 illustrates a section of a 16-state trellis for a forward pass of a NPML dual-max detector in accordance with the preferred embodiment.
Figure 8:
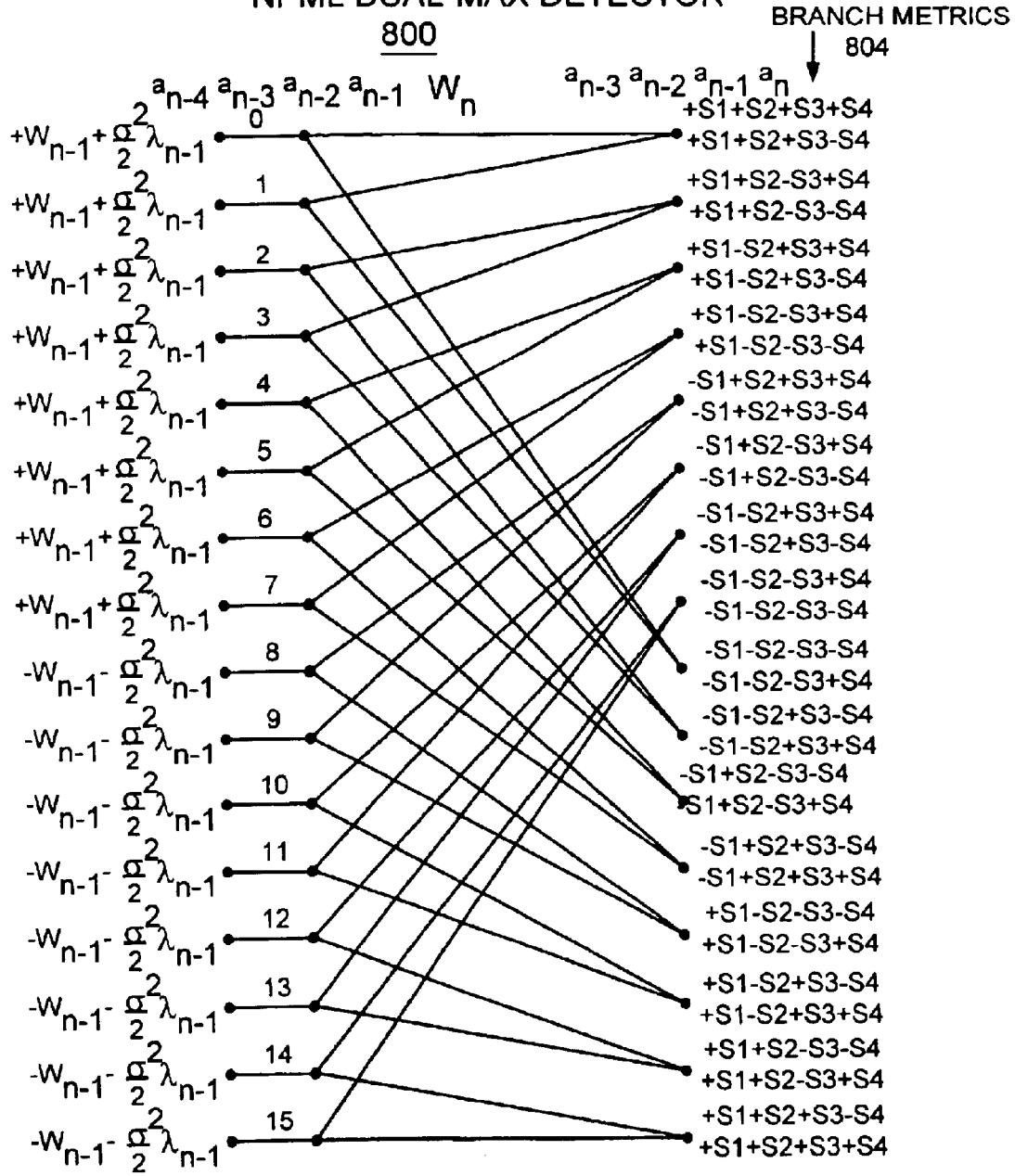
FIG. 8 illustrates a section of a 16-state trellis for a backward pass for a NPML dual-max detector in accordance with the preferred embodiment.

Referring now to FIGS. 7 and 8, FIG. 7 illustrates a section of a 16-state trellis for a forward pass of a NPML dual-max detector in accordance with the preferred embodiment generally designated by the reference character 700. FIG. 8 illustrates a section of a 16-state trellis for a backward pass for a NPML dual-max detector in accordance with the preferred embodiment generally designated by the reference character 800. FIGS. 7 and 8 show the sections of the 16-state trellis 700, 800 for implementing the dual-max algorithm according to equations (31), (32) and (33) for the forward and backward pass, respectively.

Figure 9:
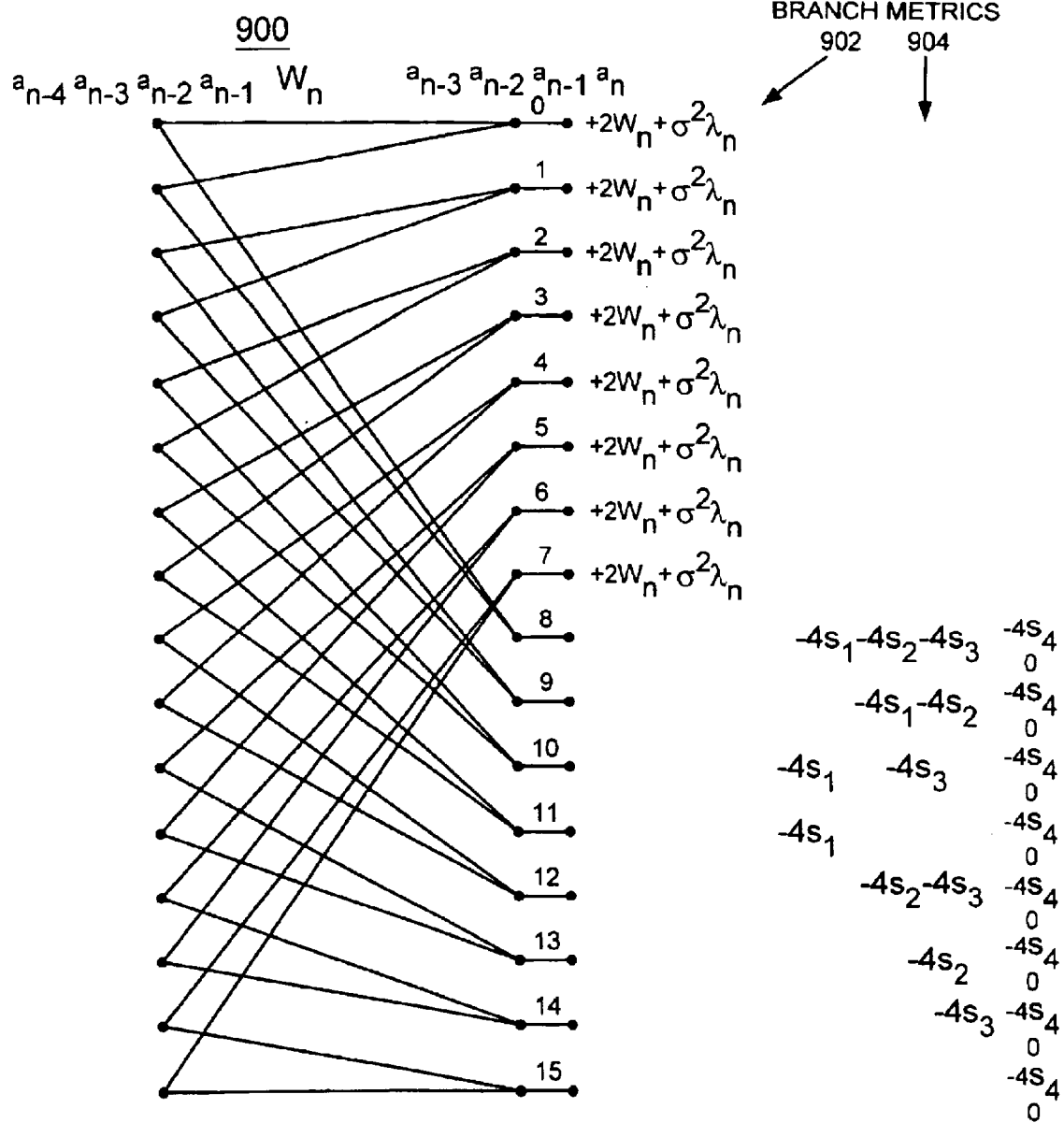
FIG. 9 illustrates an equivalent simplified trellis section for the forward pass of the FIG. 7 in accordance with the preferred embodiment.
Figure 10:
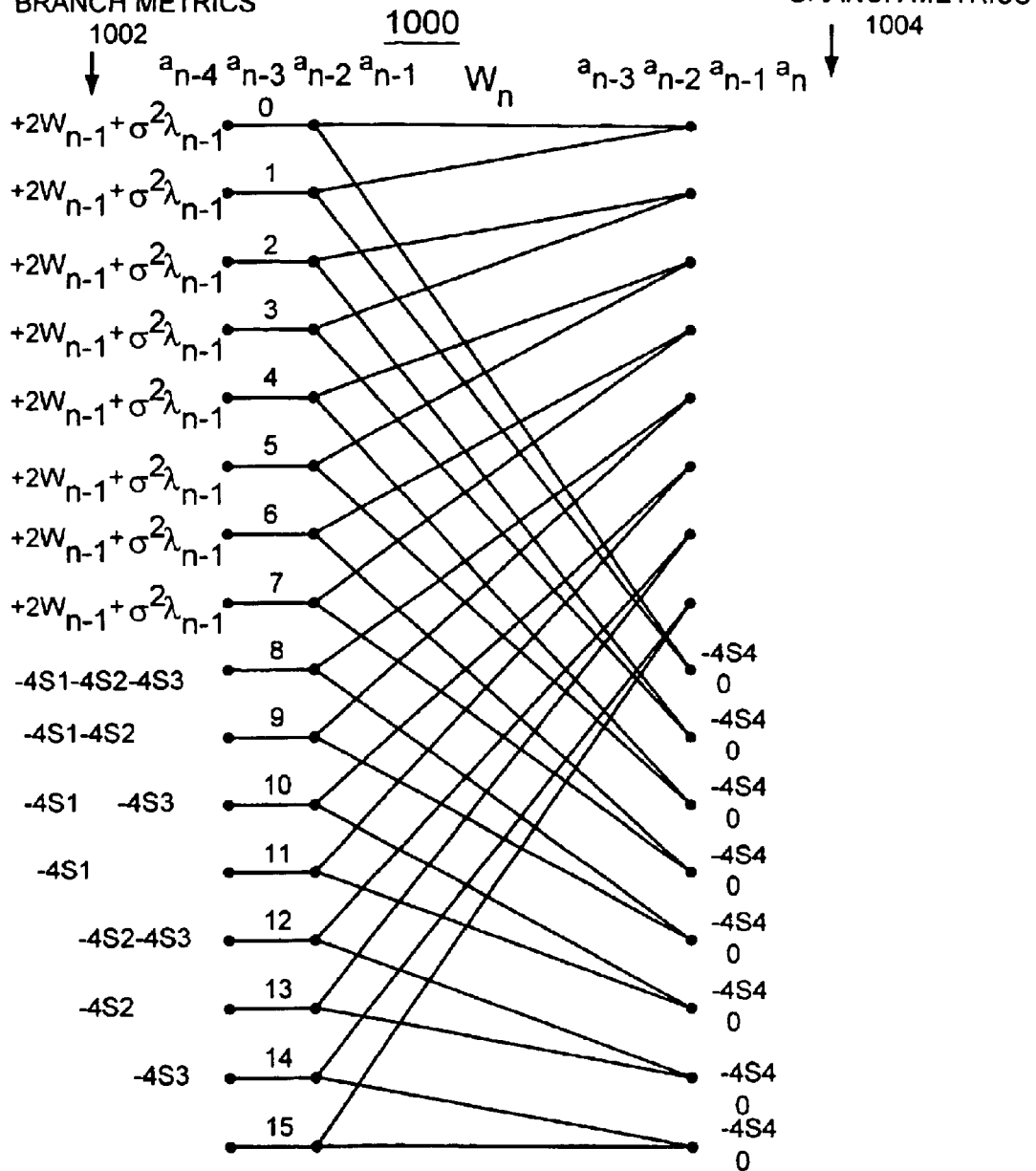
FIG. 10 illustrates an equivalent simplified trellis section for the backward pass of FIG. 8 in accordance with the preferred embodiment.

Referring now to FIGS. 9 and 10, FIG. 9 illustrates an equivalent simplified trellis section for the forward pass of the FIG. 7 in accordance with the preferred embodiment generally designated by the reference character 900. FIG. 10 illustrates an equivalent simplified trellis section for the backward pass of FIG. 8 in accordance with the preferred embodiment generally designated by the reference character 1000. FIGS. 9 and 10 show equivalent simplified trellis sections 900 and 1000 for the forward and backward pass, respectively. Note that in the trellis sections 900 and 1000 of FIGS. 9 and 10 there are 8 additions with the time-varying term 902, 1002 $2W_n + \sigma^2 \lambda_n$ and 6 additions with constant terms 904, 1004 following the ACS units in the forward or the backward directions. Besides the latency due to the additional backwards processing the dual-max algorithm has exactly the same structure as the Viterbi algorithm with soft-input reliability information described in the previous sections. Another significant hardware simplification can be obtained by setting the noise variance to 1, that is, $\sigma^2=1$. Simulation results have shown that this simplification does not incur a performance loss.

Figure 11:
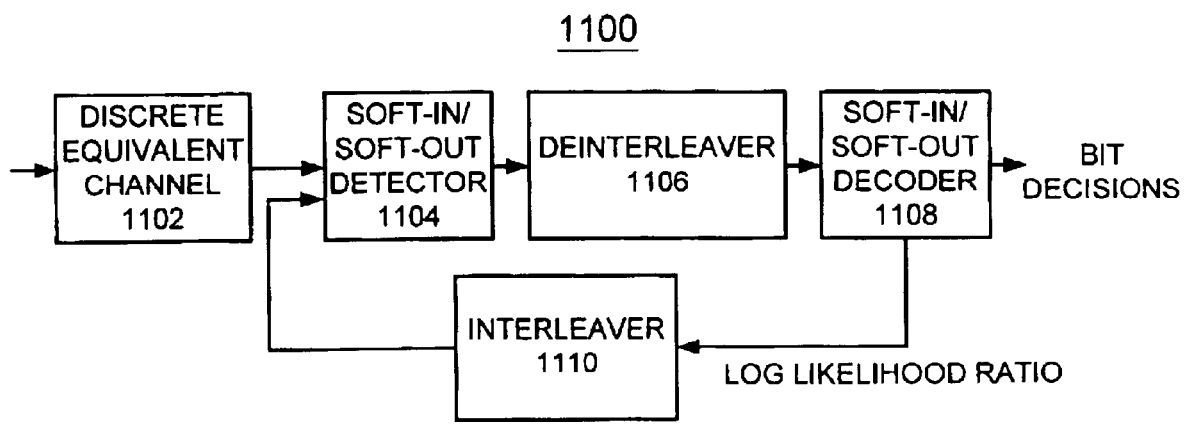
FIG. 11 illustrates is a block diagram representation illustrating a serially concatenated soft-input soft-output detector/decoder system in accordance with the preferred embodiment.

FIG. 11 illustrates a serially concatenated soft-input/soft-output detector/decoder system in accordance with the preferred embodiment generally designated by the reference character 1100. Serially concatenated soft-input soft-output detector/decoder system 1100 includes an input from an equivalent channel 1002 applied to a soft-input/soft-output detector 1104. A deinterleaver 1106 couples the soft-input/soft-output detector 1104 to a soft-input/soft-output decoder 1108. An interleaver 1110 couples a log likelihood ratio output of the serially concatenated with a soft-input/soft-output decoder 1108 to the soft-input/soft-output detector 1104. The magnetic recording channel 1002 is a typical intersymbol interference channel. Therefore, the finite state machine (FSM) representing the recording channel and the outer encoder can be conceptually treated as a serially concatenated system. This leads to soft-input/soft-output detection/decoding schemes that exchange reliability information in an iterative fashion. The soft-input/soft-output detector 1104 can be implemented according to any of the specific embodiments of the present invention. Furthermore, any soft-input/soft-output decoder 1108 can be utilized in such a serially concatenated iterative detection/decoding system. In certain cases the interleaver 1110, deinterleaver 1106 pair may not be necessary.

A particular configuration with great practical significance is the serial concatenation of a soft-input/soft-output detector, in accordance with any of the specific embodiments of the present invention, with a low density parity check (LDPC) decoder. LDPC codes are prime candidates for replacing the traditional Reed-Solomon ECC in recording applications.

Figure 12:
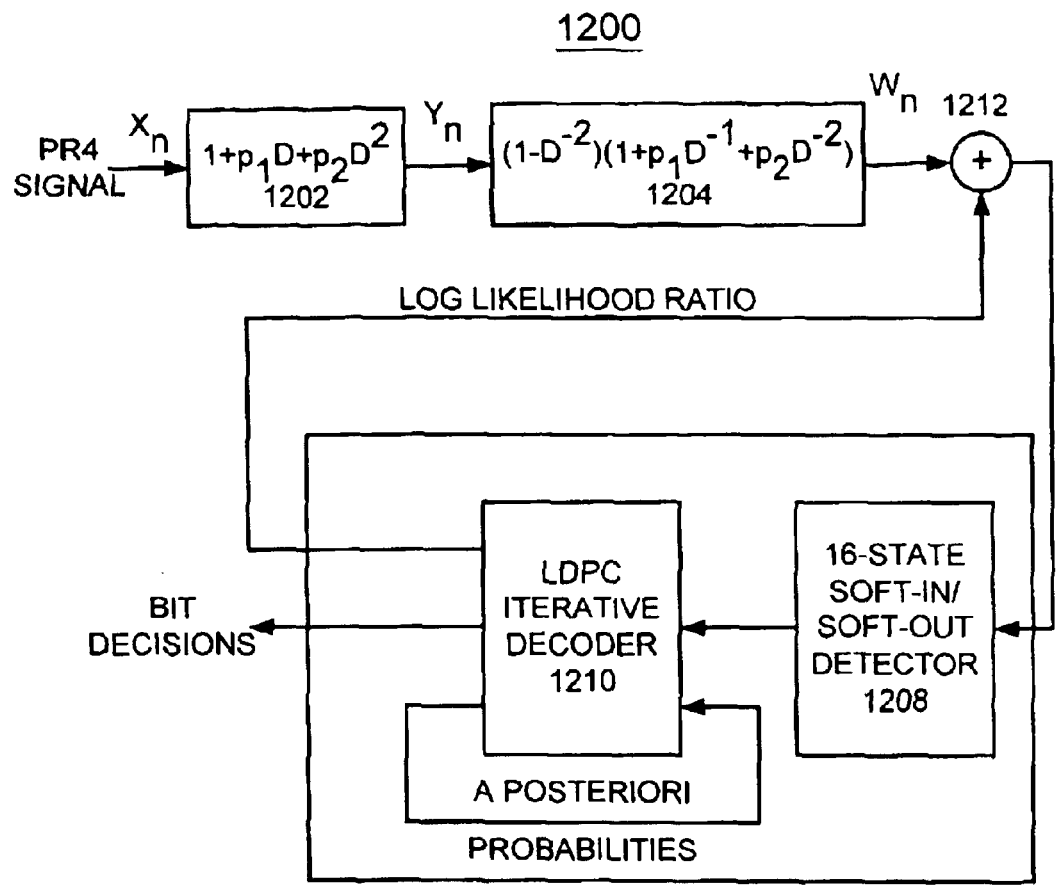
FIG. 12 illustrates is a block diagram representation illustrating a serially concatenated 16-state NPML soft-input soft-output detector with low density parity check (LDPC) decoder system in accordance with the preferred embodiment.

FIG. 12 illustrates a serially concatenated 16-state NPML soft-input soft-output detector with LDPC decoder system in accordance with the preferred embodiment generally designated by the reference character 1200. Serially concatenated 16-state NPML soft-input soft-output detector with LDPC decoder system 1200 receives a partial response class 4 (PR4) signal input followed by a whitening/predictor filter $1+p1D+p2D^2$ 1202, a matched filter $(1-D^{-2})(1+p1D^{-1}+p2D^{-2})$ 1204, a corresponding 16-state soft-input, soft-output detector 1208, and a LDPC iterative decoder 1210. The 16-state soft-input, soft-output detector 1208 is serially concatenated with the LDPC iterative decoder 1210 that provides bit decisions and a log-likelihood ratio outputs. The output of the whitening/predictor filter $1+p1D+p2D^2$ 1202 is the whitened output $y_n$. The matched-filter $(1-D^{-1})(1+p1D^{-1}+p2D^{-2})$ 1204 facilitates the transformation of the trellis according to the metric in equation (12) providing an output $W_n$. A soft-input, a priori log-likelihood ratio term, such as, $(\sigma^2/2)\lambda n$ is added by an adder 1212 at the output of the matched filter 1204. The recording channel is shaped to a NPML target with 2 predictor coefficients, that is, L=4, is given by $F(D)=(1-D^2)(1+p1D+p2D^2)$. This target gives rise to a 16-state trellis for the soft-input, soft-output detector 1208.

While the present invention has been described with reference to the details of the embodiments of the invention shown in the drawing, these details are not intended to limit the scope of the invention as claimed in the appended claims.

What is claimed is:

1. A method for implementing soft-input soft-output detectors/decoders comprising the steps of:
   receiving incoming channel samples;
   adding soft-input information directly to said received incoming channel samples;
   detecting input signals from said received incoming channel samples with said added soft-input information using a detector trellis including transforming branch metric terms to shift all time varying terms with said added soft-input information and some constant terms after an add compare select (ACS) unit; and adding said shifted time varying terms with said added soft-input information and said shifted constant terms directly to state metric terms.

2. A method for implementing soft-input soft-output detectors/decoders as recited in claim 1 wherein said soft-input information are expressed as a priori probability information.

3. A method for implementing soft-input soft-output detectors/decoders as recited in claim 1 wherein said soft-input information are expressed as a likelihood ratio information.

4. A method for implementing soft-input soft-output detectors/decoders as recited in claim 1 wherein said shifted time varying terms with said added soft-input information are expressed as channel output dependent terms and a priori probability terms of the branch metric represented by $a_n W_n$ and $\sigma^2 \ln P(a_n)$, wherein said time varying terms are expressed as outputs $W_n$ of a matched filter and $a_n$ is a data symbol at time nT, and said a priori probability terms are expressed as $\sigma^2 \ln P(a_n)$ where $\sigma^2$ represents variance and $\ln P(a_n)$ represents a priori probability of data symbol $a_n$.

5. A method for implementing soft-input soft-output detectors/decoders as recited in claim 1 wherein said shifted time varying terms with said added soft-input information are expressed as channel output dependent terms and log-likelihood ratio terms represented by $a_n w_n$ and $\lambda_n$ wherein said time varying terms are expressed as outputs $W_n$ of a matched filter and $a_n$ is a data symbol at time nT, and said $\lambda_n$ represents said log-likelihood ratio of said data symbol a priori probabilities and is represented by:

$$\lambda_n = \ln\{P(a_n=+1)/P(a_n=-1)\}.$$

6. A method for implementing soft-input soft-output detectors/decoders as recited in claim 1 wherein the step of adding said shifted time varying terms with said added soft-input information and said shifted constant terms directly to state metric terms includes the step of processing multiple samples per trellis branch.

7. A method for implementing soft-input soft-output detectors/decoders as recited in claim 1 further includes the step of setting a noise variance term $\sigma$ of said soft-input information equal to one.

8. A method for implementing soft-input soft-output detectors/decoders as recited in claim 1 wherein the step of transforming branch metric terms to shift all time varying terms with said added soft-input information and some constant terms after an add compare select (ACS) unit is performed for both a forward trellis section and a backward trellis section for implementing a dual-maxima detection algorithm.

9. A method for implementing soft-input soft-output detectors/decoders as recited in claim 1 wherein the step of detecting input signals comprising said received incoming channel samples with said added soft-input information using a detector trellis includes the step of detecting input signals comprising said received incoming channel samples with said added soft-input information using an extended partial-response maximum likelihood (EPRML) detector.

10. A method for implementing soft-input soft-output detectors/decoders as recited in claim 1 wherein the step of detecting input signals comprising said received incoming channel samples with said added soft-input information using a detector trellis includes the step of detecting input signals comprising said received incoming channel samples with said added soft-input information using a noise predictive maximum likelihood (NPML) detector.

11. A method for implementing soft-input soft-output detectors/decoders as recited in claim 1 wherein the step of detecting input signals comprising said received incoming channel samples with said added soft-input information using a detector trellis includes the step of detecting input signals comprising said received incoming channel samples with said added soft-input information using a generalized partial response (GPR) detector.

12. A method for implementing soft-input soft-output iterative detectors/decoders as recited in claim 1 wherein the step of detecting input signals comprising said received incoming channel samples with said added soft-input information using a detector trellis includes the step of detecting input signals comprising said received incoming channel samples with said added soft-input information using an $2^N$-state trellis detector, where N represents an integer value.

13. An Apparatus for implementing soft-input soft-output detectors/decoders for detection of channel signals comprising:

an adder for adding soft-input information directly to incoming channel samples;

a detection trellis coupled to said adder and having transformed branch metric terms to shift all time varying terms with said added soft-input information and some constant terms after an add compare select (ACS) unit; and said detection trellis having branch adders for adding said shifted time varying terms and said shifted constant terms directly to state metric terms.

14. An Apparatus for implementing soft-input soft-output detectors/decoders for detection of channel signals as recited in claim 13 includes a soft-input soft-output detector serially concatenated with a soft-input-soft-output decoder.

15. An Apparatus for implementing soft-input soft-output detectors/decoders for detection of channel signals as recited in claim 14 wherein said soft-input soft-output decoder includes a low density parity check (LDPC) decoder.

16. An Apparatus for implementing soft-input soft-output detectors/decoders for detection of channel signals as recited in claim 13 wherein said detection trellis comprising an extended partial-response maximum likelihood (EPRML) detection trellis.

17. An Apparatus for implementing soft-input soft-output detectors/decoders for detection of channel signals as recited in claim 13 wherein said detection trellis comprising a noise predictive maximum likelihood (NPML) detection trellis.

18. An Apparatus for implementing soft-input soft-output detectors/decoders for detection of channel signals as recited in claim 13 wherein said detection trellis comprising a forward trellis section and a backward trellis section for implementing a dual-maxima detection algorithm.

19. An Apparatus for implementing soft-input soft-output detectors/decoders for detection of channel signals as recited in claim 18 wherein both said forward trellis section and said backward trellis section having transformed branch metric terms to shift all time varying terms with said added soft-input information after said add compare select (ACS) unit.

20. An Apparatus for implementing soft-input soft-output detectors/decoders for detection of channel signals as recited in claim 13 wherein said shifted time varying terms with said added soft-input information are expressed as channel output dependent terms and a priori probability terms of the branch metric represented by $a_n W_n$ and $\sigma^2 \ln P(a_n)$, wherein said time varying terms are expressed as outputs $W_n$ of a matched filter and $a_n$ is a data symbol at time nT, and said a priori probability terms are expressed as $\sigma^2 \ln P(a_n)$ where $\sigma^2$ represents variance and $\ln P(a_n)$ represents a priori probability of data symbol $a_n$.

21. An Apparatus for implementing soft-input soft-output detectors/decoders for detection of channel signals as recited in claim 13 wherein said shifted time varying terms with said added soft-input information are expressed as channel output dependent terms and log-likelihood ratio terms represented by $a_n W_n$ and $\lambda_n$ wherein said time varying terms are expressed as outputs $W_n$ of a matched filter and $a_n$ is a data symbol at time nT, and said $\lambda_n$ represents said log-likelihood ratio of said data symbol a priori probabilities and is represented by:

$$\lambda_n = \ln\{P(a_n=+1)/P(a_n=-1)\}.$$

* * * * *